United States Patent
Lee et al.

(10) Patent No.: US 7,332,973 B2
(45) Date of Patent: Feb. 19, 2008

(54) CIRCUIT AND METHOD FOR DIGITAL PHASE-FREQUENCY ERROR DETECTION

(75) Inventors: Hoon Lee, Irvine, CA (US); Tirdad Sowlati, Irvine, CA (US)

(73) Assignee: Skyworks Solutions, Inc., Woburn, MA (US)

(*) Notice: Subject to any disclaimer, the term of this patent is extended or adjusted under 35 U.S.C. 154(b) by 112 days.

(21) Appl. No.: 11/265,442

(22) Filed: Nov. 2, 2005

(65) Prior Publication Data

US 2007/0096836 A1    May 3, 2007

(51) Int. Cl.
*H03L 7/089* (2006.01)
*H03L 7/097* (2006.01)

(52) U.S. Cl. .............. 331/25; 327/12; 327/156

(58) Field of Classification Search .......... 331/25; 327/12, 156
See application file for complete search history.

(56) References Cited

U.S. PATENT DOCUMENTS 5,270,666 A * 12/1993 Rapeli et al. ............ 329/341
6,850,051 B2 * 2/2005 Roberts et al. .......... 324/76.54
7,046,098 B2 * 5/2006 Staszewski .............. 331/158

OTHER PUBLICATIONS

Pereira, Paula et al., "Wallace Tree Encoding in Folding and Interpolation ADCs", May 26, 2002, IEEE Circuits and Systems, 2002. ISCAS 2002. IEEE International Symposium on, INESC-ID-Lisboa, Portugal.*

* cited by examiner

*Primary Examiner*—Robert Pascal
*Assistant Examiner*—James Goodley (57) ABSTRACT

A time-to-digital converter comprises a ring oscillator, a counter, an encoder, and a multi-bit latch. The ring oscillator comprises a first input and a clock input, as well as, a first output responsive to a single cycle of the ring oscillator and a second output responsive to a signal applied at the first input. A counter coupled to the first output generates a first binary word. An encoder coupled to the second output generates a second binary word. The multi-bit latch receives the first and second binary words and generates a composite representation of a phase-frequency error signal. The time-to-digital converter is well suited for digital phase-locked loops used in communications applications and digital phase-locked loops in electromechanical control systems that require high-precision phase-frequency error detection.

20 Claims, 9 Drawing Sheets

CIRCUIT AND METHOD FOR DIGITAL PHASE-FREQUENCY ERROR DETECTION

BACKGROUND

A variety of electronic devices, such as computers, monitors, flat panel displays, wireless communication devices, cellular phones, high speed two-way digital transceivers, and paging devices, to name just a few, utilize synchronous signals, such as, clock signals, vertical-synch and horizontal-synch signals, spread spectrum and digital wireless communication signals, etc., that are phase synchronized with other signals associated with such devices. Another variety of electromechanical devices such as compact disc players and digital video disc drives require close tracking of one or more physical elements in a control system. A phase-locked loop circuit is used to perform the described signal synchronization and tracking functions. A phase-locked loop is a closed loop frequency control system. A phase-locked loop generally includes a phase detector, an amplifier, and a controlled oscillator.

Phase-locked loop circuits have been conventionally manufactured using analog circuit construction. An analog phase detector in a phase-locked loop produces an analog output signal, for example a voltage signal, to indicate a phase difference between two signals. In a phase-locked loop, for example, this analog signal may control a frequency source, such as a voltage controlled oscillator (VCO). High precision adjustments in the frequency signal output from the VCO may depend on very precise components and custom analog circuit design when the phase detector is an analog phase detector.

Analog phase-locked loops, as with most analog circuit designs, suffer from sensitivity to noise signals, temperature variability, and manufacturing process variations. Further, increasing the precision of an analog circuit may require significant additional component cost and multiple fabrication iterations. Moreover, analog circuit designs tend to require relatively large circuit footprints to implement a precision phase-locked loop circuit. Additionally, as with any analog circuit design, the design time tends to be long to transfer a design to a new circuit manufacturing process. To transfer an analog phase-locked loop to a new manufacturing process, the design effort and risk are substantially the same as with the original design.

Conventional phase detectors include two basic types. A Type-I phase detector is designed to be driven by analog signals or digital square-wave signals, whereas a Type-II phase detector is driven by digital transitions. In its simplest form the Type-I phase detector (digital) can be implemented using an exclusive-OR gate, the output of which is "on" when a signal voltage differs from a reference voltage. The Type-II phase detector is sensitive only to the relative timing of edges between the reference signal and a second signal. The Type-II phase detector generates either lead or lag output pulses, depending on whether the output transitions from the controlled oscillator occur before or after the transitions from the reference signal, respectively. The width of the lead or lag pulses is equal to the time between the respective edges. Output circuitry either sinks or sources current during those pulses and is otherwise open-circuited. The occurrence of output pulses (or the lack thereof) generated by the Type-II phase detector is independent of the duty cycle of the input signals, unlike what occurs with a Type-I phase detector. Another useful feature of the Type-II phase detector is that the output pulses disappear when the two signals are "locked" or in phase with each other. Consequently, there is no undesired voltage ripple present at the output to add periodic phase modulation in the loop as with the Type-I phase detector. Because the output of a Type-I phase detector is always generating an output wave, the output wave must be low-pass filtered to smooth the output signal. Consequently, ripple and periodic phase variations are present in a loop with a Type-I phase detector.

In circuits where phase-locked loops are used for frequency synthesis, the Type-I phase detector adds phase-modulation sidebands to the output signal. Unlike the Type-I phase detector, which is always generating an output signal, the Type-II phase detector generates output pulses only when there is a phase error between an input signal and a reference signal. Since the phase detector output otherwise looks like an open circuit, a loop filter capacitor acts as a voltage storage device, holding the voltage that generates the correct oscillator frequency. If the frequency of the reference signal changes, the phase detector generates a train of short pulses that charge or discharge the loop filter capacitor to the voltage desired to return the oscillator frequency to the lock frequency.

U.S. Pat. No. 6,429,693 describes a digital fractional phase detector using a delay chain to measure fractional delay differences between the significant edge of a VCO output clock and a reference clock by using a time-to-digital converter to express the time difference as a digital word for use by the frequency synthesizer. The circuit area required to implement the digital fractional phase detector is dominated by the area of the time-to-digital converter, which comprises a plurality of inverters coupled in series with a respective latch or register coupled at the output of each of the inverters. A reference signal is used to clock a respective input into each latch. The output of every other latch is inverted before being forwarded to an edge detector. The circuit area required to implement the digital fractional phase detector is proportional to the maximum detectable phase difference as determined by the number of bits in the converter and inversely proportional to the length of time that can be resolved in the delay portion. Thus, with increasing demands on precision comes a need for additional circuit area.

With the increasing popularity of digital circuits in all of the aforementioned electronic and electromechanical devices, current trends are toward smaller and more compact devices requiring smaller circuit designs, continuous improvements in circuit manufacturing technologies requiring easily adaptable circuit designs for new technologies, and increasing demand for higher precision phase synchronization.

Therefore, it would be desirable to provide a reliable, high-precision phase detector that can be realized using less circuit area than conventional designs.

SUMMARY

Embodiments of a time-to-digital converter comprise a ring oscillator, counter, encoder, and a latch. The ring oscillator has a first input, a clock input, a first output responsive to a single cycle of the ring oscillator and a second output responsive to a signal applied at the first input. The counter is coupled to the first input and generates a first binary word. The encoder is coupled to the second output and generates a second binary word. The latch is coupled to the counter and the encoder, such that the latch generates a composite word comprising the first and second binary words.

One embodiment of a method for phase frequency error detection comprises monitoring an input pulse responsive to the relative phase frequency difference between a first signal and a reference signal, generating a first binary word responsive to the time the input pulse exceeds a threshold, the first binary word comprising an integer multiple of a delay unit, generating a thermometer coded word responsive to the time the input pulse exceeds a threshold in addition to the time represented by the first binary word, converting the thermometer coded word to a second binary word and generating a digital representation of the phase frequency error responsive to the first and second binary words.

Embodiments of a portable transceiver comprise an antenna and a radio-frequency subsystem. The radio-frequency subsystem is coupled to the antenna and comprises a frequency synthesizer with a phase-locked loop. The phase-locked loop uses a time-to-digital converter to generate a phase frequency error signal. The time-to-digital converter comprises a ring oscillator, a counter, an encoder, and a latch. The ring oscillator comprises a first input and a clock input, as well as, a first output responsive to a single cycle of the ring oscillator and a second output responsive to a signal applied to the first input. The counter is coupled to the first output and generates a first binary word. The encoder is coupled to the second output and configured to generate a second binary word. The latch is coupled to the counter and the encoder such that the latch generates a composite word comprising the first and second binary words.

The figures and detailed description that follow are not exhaustive. The disclosed embodiments are illustrated and described to enable one of ordinary skill to make the time-to-digital error detector and use the same in phase-locked loops suitable for frequency synthesizers in electronic and electromechanical devices. Other embodiments, features and advantages of the time-to-digital error detector and method for phase frequency error detection will be or will become apparent to those skilled in the art upon examination of the following figures and detailed description. All such additional embodiments, features and advantages are within the scope of the circuits and methods for phase frequency error detection as described in the accompanying claims.

BRIEF DESCRIPTION OF THE FIGURES

The circuits and methods for phase frequency error detection can be better understood with reference to the following figures. The components within the figures are not necessarily to scale, emphasis instead being placed upon clearly illustrating the principles behind the circuits and methods. Moreover, in the figures, like reference numerals designate corresponding parts throughout the different views.

DETAILED DESCRIPTION

Although described with particular reference to operation within a portable transceiver, the various circuits described below can be implemented in a myriad of devices and applications where it is desirable to provide a high precision digital phase-locked loop. For example, the time-to-digital converter of FIG. 4 may be used in electromechanical devices where a high precision control system is desired.

The time-to-digital converter is a hardware device that can include any or a combination of the following technologies, which are all well known in the art: discrete electronic components, an integrated circuit, an application-specific integrated circuit having appropriately configured semiconductor devices and resistive elements, etc. The output of a ring oscillator within the time-to-digital converter is recycled. The number of state changes at the output of the ring oscillator is used to generate a coarse time measurement. A fine time measurement with a more precise resolution is performed by monitoring the state of each delay unit in a delay chain within the ring oscillator. The least significant bit of the fine time measurement has the same resolution of the propagation delay of a delay unit. The least significant bit of the coarse time measurement result has the weight of the total delay time in the delay chain.

In preferred embodiments of the time-to-digital converter, the ring oscillator comprises a delay line having a plurality of delay elements the resolution of which is at least two orders of magnitude shorter in time than the width of a target pulse. In addition, the total delay through the ring oscillator is shorter in time by at least an order of magnitude than the width of a target pulse. The time-to-digital converter generates a composite word that comprises a set of most significant bits the maximum resolution of which represent a time that is longer in duration than a target reference cycle and a set of least significant bits that represent a time that approximates the delay of a signal propagated through a series-coupled inverter pair.

The time-to-digital converter illustrated below provides a flexible solution that enables circuit designers to obtain a high-precision phase frequency error signal while minimizing the circuit area significantly. Simulations indicate circuit area reduction of approximately 68% when a 64-bit thermometer coded word is used as part of the phase frequency error signal when compared to conventional time-to-digital converters that use longer delay lines. Circuit area can be further reduced by using a 32-bit thermometer coded word. While the illustrated embodiments generate an 11-bit composite word comprising 6 least-significant bits from the ring oscillator and 5 most-significant bits from the edge counter, those skilled in the art will understand that other combinations are possible.

When a portable transceiver is implemented partially in software, the software portion can be used to generate one or more control inputs that direct a frequency synthesizer with a phase-locked loop to generate a plurality of frequencies suited for application in upconverters and downconverters in a radio-frequency subsystem of the transceiver. The software can be stored in a memory and executed by a suitable instruction execution system (microprocessor). The software for operating the frequency synthesizer may comprise an ordered listing of executable instructions for implementing logical functions, and can be embodied in any "computer-readable medium" for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device.

Figure 1:
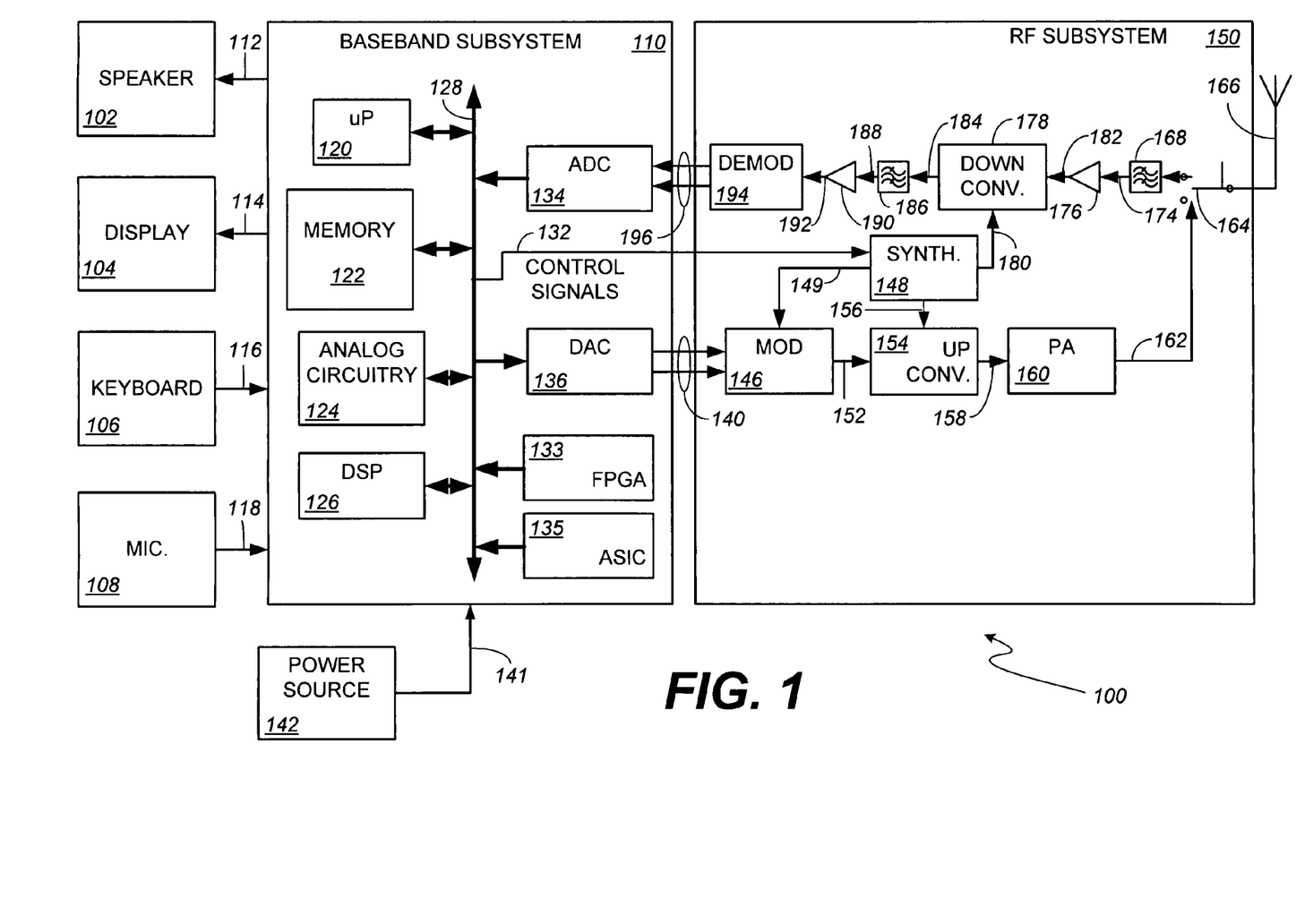
FIG. 1 is a block diagram of an embodiment of a portable transceiver.

Turning now to the drawings, wherein like reference numerals designate corresponding parts throughout the drawings, reference is made to FIG. 1, which illustrates a portable transceiver 100. Portable transceiver 100 includes speaker 102, display 104, keyboard 106, and microphone 108, all connected to baseband subsystem 110. A power source 142, which may be a direct current (DC) battery or other power source, is also connected to the baseband subsystem 110 via connection 141 to provide power to the portable transceiver 100. In a particular embodiment, portable transceiver 100 can be, for example but not limited to, a portable telecommunication device such as a mobile cellular-type telephone. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. Baseband subsystem 110 includes microprocessor (µP) 120, memory 122, analog circuitry 124, and digital signal processor (DSP) 126 in communication via bus 128. Bus 128, although shown as a single bus, may be implemented using multiple busses connected as necessary among the subsystems within baseband subsystem 110.

In one embodiment, depending on the manner in which the frequency synthesizer 148 to be described below is implemented, the baseband subsystem 110 may also include an application specific integrated circuit (ASIC) 135 and/or a field programmable gate array (FPGA) 133.

Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to radio-frequency (RF) subsystem 150 via connection 132. Although shown as a single connection 132, the control signals may originate from the DSP 126, the ASIC 135, the FPGA 133, or from microprocessor 120, and are supplied to a variety of connections within RF subsystem 150. It should be noted that, for simplicity, only the basic components of portable transceiver 100 are illustrated herein. The control signals provided by the baseband subsystem 110 control the various components within RF subsystem 150, such as frequency synthesizer 148.

If frequency control in the RF subsystem 150 is implemented wholly or partially in software that is executed by the microprocessor 120, the memory 122 will also include control software (not shown). The control software comprises one or more executable code segments that can be stored in the memory and executed in the microprocessor 120. Alternatively, the functionality of the control software can be coded into the ASIC 135 or can be executed by the FPGA 133. Because the memory 122 can be rewritable and because the FPGA 133 is reprogrammable, updates to the control software can be remotely sent to and saved in the portable transceiver 100 when implemented using either of these methodologies.

Baseband subsystem 110 also includes analog-to-digital converter (ADC) 134 and digital-to-analog converter (DACs) 136. ADC 134 and DAC 136 may also communicate with microprocessor 120, memory 122, analog circuitry 124 and DSP 126 via bus 128. DAC 136 converts the digital communication information within baseband subsystem 110 into an analog signal for transmission to a modulator 146 via connection 140. Connection 140, while shown as two directed arrows, includes the information that is to be transmitted by the RF subsystem 150 after conversion from the digital domain to the analog domain.

RF subsystem 150 includes modulator 146, which modulates the analog information in connection 140 and provides a modulated signal via connection 152 to upconverter 154. When RF subsystem 150 is directed to apply frequency modulation to the analog information, modulator 146 applies frequency modulation in accordance with a reference frequency forwarded from synthesizer 148 via connection 149. The upconverter 154 transforms and amplifies the modulated signal on connection 152 to an appropriate transmit frequency and power level for the system in which the portable transceiver 100 is designed to operate. Upconverter 154 converts the modulated signal to a RF transmit frequency in accordance with a reference frequency forwarded from synthesizer 148 via connection 156. Details of the modulator 152 and the upconverter 154 have been omitted for simplicity, as they will be understood by those skilled in the art. For example, the data on connection 140 is generally formatted by the baseband subsystem 110 into in-phase (I) and quadrature-phase (Q) components. The I and Q components may take different forms and be formatted differently depending upon the communication standard being employed.

The upconverter 154 supplies the upconverted signal via connection 158 to power amplifier 160. Power amplifier 160 amplifies the modulated signal and couples the amplified signal via connection 162 to switch 164. Switch 164 controllably forwards signals to be transmitted to antenna 166 and directs received signals from antenna 166 to surface acoustic wave (SAW) filter 168. Alternatively, switch 164 can be replaced by a duplexer. A suitable duplexer comprises a filter pair that allows simultaneous passage of both transmit signals and receive signals, as known to those having ordinary skill in the art.

A signal received by antenna 166 is directed from the switch 164 to RF SAW filter 168 which will permit only a narrow range of frequencies to be forwarded to amplifier 176 along connection 174. The filtered and amplified RF signal is forwarded along connection to 182 to downconverter 178. The downconverter 178 may include a low-noise amplifier (LNA) (not shown) and circuitry (not shown) to convert the received signal from an RF level to an intermediate frequency (IF) in accordance with a reference frequency forwarded from synthesizer 148 via connection 180. The downconverted signal is forwarded along connection 184 to IF SAW filter 186 which permits only a narrow range of frequencies to be forwarded along connection 188 to amplifier 190. Amplifier 190 amplifies the filtered IF signal and forwards the amplified IF signal along connection 192 to demodulator 194. The demodulator 194 recovers the transmitted analog information and supplies a signal representing this information via connection 196 to ADC 134. ADC 134 converts these analog signals to a digital signal at baseband frequency and transfers the signal via bus 128 to DSP 126 for further processing.

Figure 2:
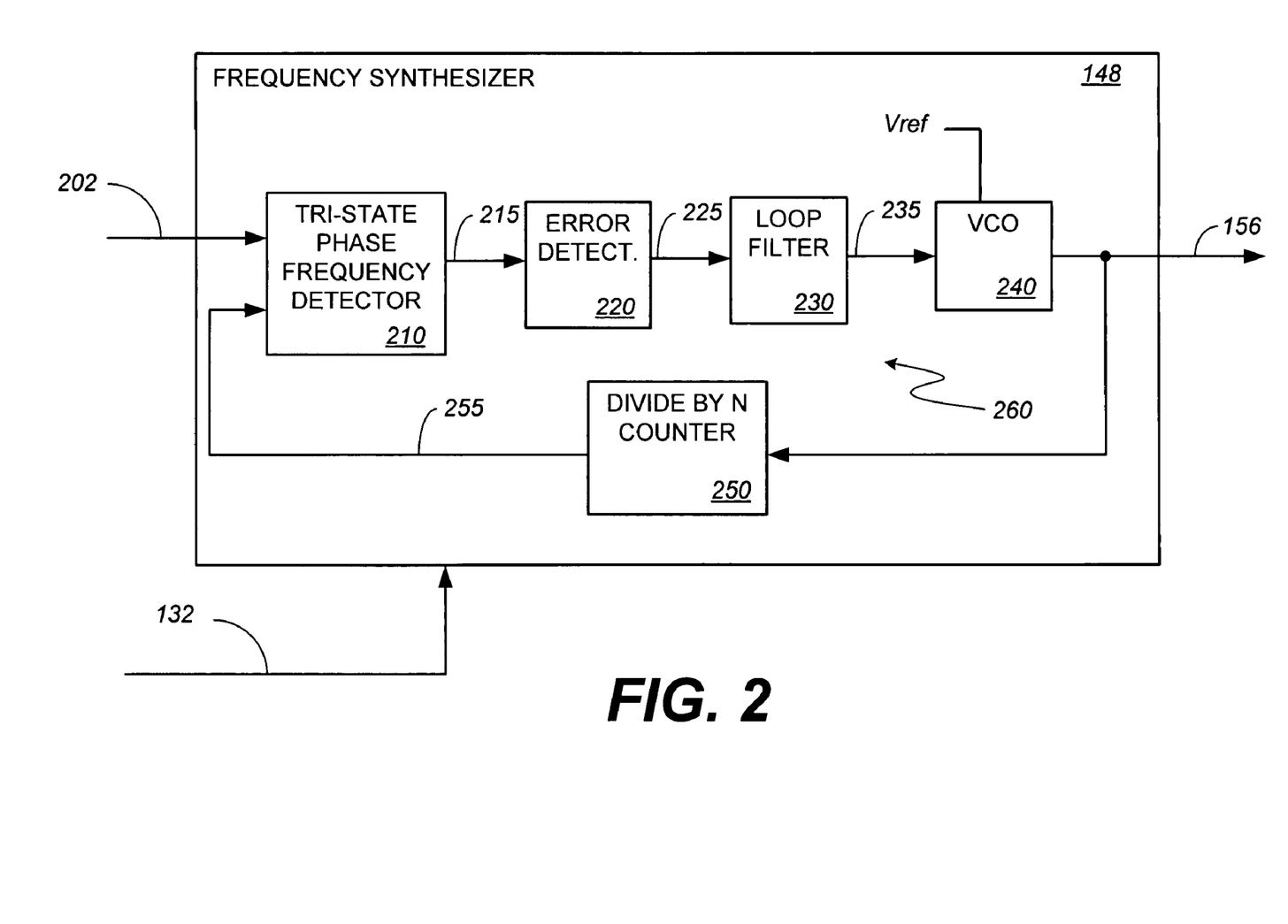
FIG. 2 is a block diagram illustrating an embodiment of the frequency synthesizer of FIG. 1.

FIG. 2 is a block diagram illustrating an embodiment of the frequency synthesizer 148 of FIG. 1. Frequency synthesizer 148 receives an input signal along conductor 202, one or more control signals along connection 132 and generates a phase-locked output signal which it provides along conductor 156. A phase-locked loop 260 is formed by the series coupling of a tri-state phase frequency detector 210, error detector 220, loop filter 230, and VCO 240, with a divide by N counter 250, which samples and provides a feedback signal from the VCO 240 to tri-state phase frequency detector 210.

Tri-state phase frequency detector 210 receives the input signal on conductor 202 and the sampled reference signal on conductor 255 (also commonly referred to as a feedback signal) and in turn generates lead and/or lag signals having a pulse width that approximates the difference in phase/frequency between the input signal along conductor 202 and the sampled reference signal on conductor 255. The lead/lag signals are forwarded along connection 215 to error detector 220. Error detector 220 receives the lead/lag signal pulses and generates a phase frequency error signal on conductor 225 responsive to the width of the lead/lag signal pulses on conductor 215. The phase frequency error signal is low-pass filtered by digital loop filter 230 to remove any ringing and other undesired variation from the phase frequency error signal. The filtered phase frequency error signal is forwarded along connection 235 to VCO 240. VCO 240 produces a signal having a frequency that is responsive to a reference signal Vref and the phase frequency error signal provided on connection 235. The VCO output signal is coupled along connection 156 to one or more upconverters and/or downconverters as desired. Vref and N are responsive to one or more control signals provided along connection 132 to enable frequency synthesizer 148 to generate output an output signal having the desired frequency.

Figure 3:
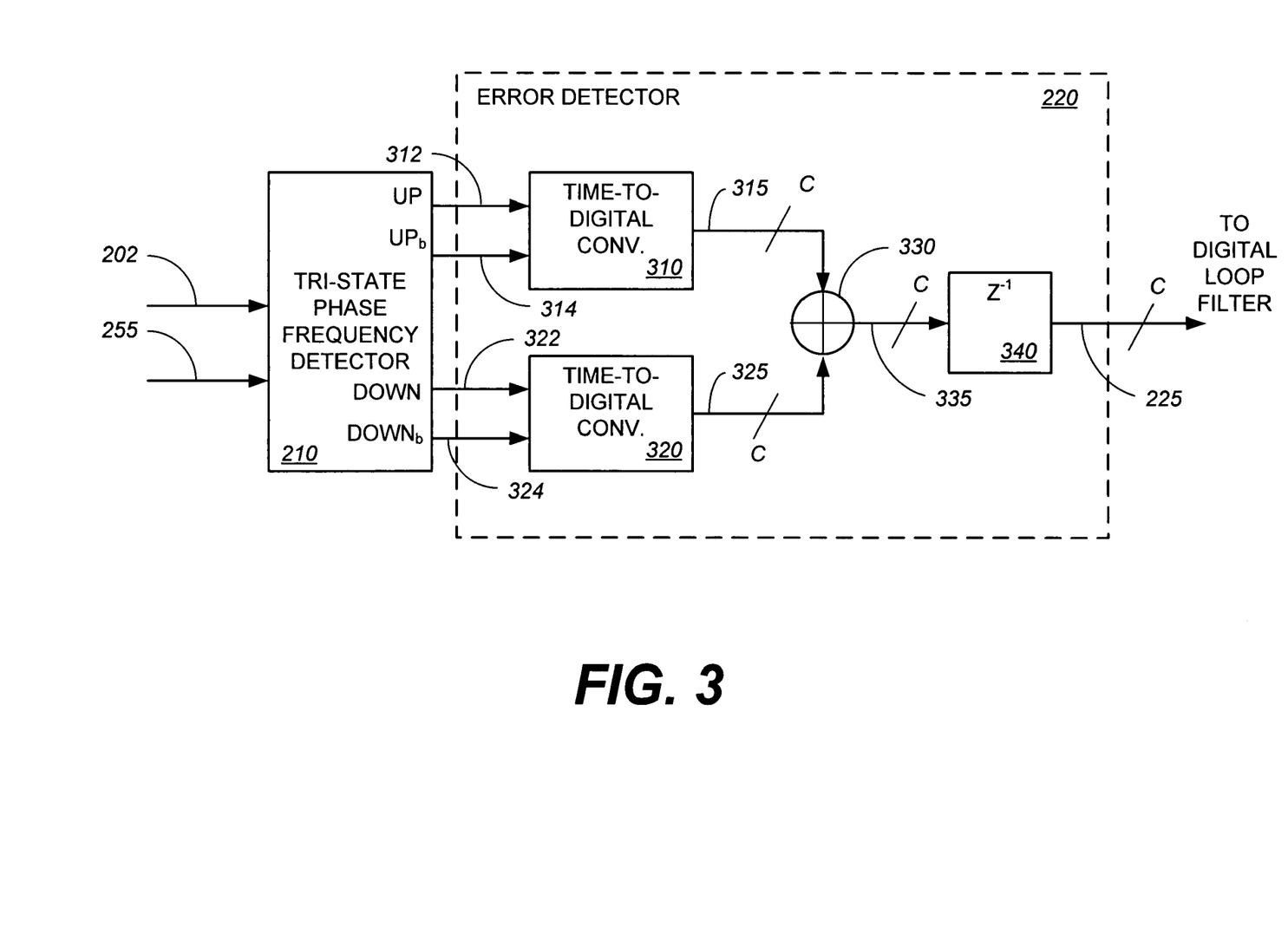
FIG. 3 is a block diagram illustrating an embodiment of the error detector of FIG. 2.

FIG. 3 is a block diagram illustrating an embodiment of the error detector 220 of FIG. 2. Error detector 220 comprises time-to-digital converter 310, time-to-digital converter 320, summing element 330 and delay element 340. Time-to-digital converter 310 receives differential signal inputs UP and $UP_b$ via input conductor 312 and input conductor 314, respectively. The input pulses provided by differential signals UP and $UP_b$ indicate a lead condition. That is, a first signal applied via conductor 202 to the tri-state phase frequency detector leads a reference signal supplied via conductor 255 to the tri-state phase frequency error detector. Time-to-digital converter 320 is configured similarly to time-to-digital converter 310. Time-to-digital converter 320 receives differential signal inputs DOWN and $DOWN_b$ via input conductor 322 and input conductor 324, respectively, and generates a composite binary word that is responsive to the pulse. The input pulses provided by differential signals DOWN and $DOWN_b$ are responsive to a lag condition. That is, a first signal applied via conductor 202 to the tri-state phase frequency detector lags a reference signal supplied via conductor 255 to the tri-state phase frequency error detector. Regardless of whether the tri-state phase frequency detector 210 identifies a lead or a lag condition, the difference in time between the first signal and the reference signal is reflected in the width or duration of the pulse on conductor pairs 312, 314 and 322, 324.

When the input signal on conductor 202 leads the reference signal on conductor 255, time-to-digital converter 310 forwards the composite word on bus 315 to summer 330. The composite word comprises at least first and second binary words. Summer 330 forwards the composite word along bus 335 to delay element 340, which prepares the digital representation of the phase-frequency error signal for digital loop filtering and forwards the delayed representation along conductor 225.

When the input signal on conductor 202 lags the reference signal on conductor 255, time-to-digital converter 320 forwards the composite word on bus 325 to summer 330. The composite word comprises at least first and second binary words. Summer 330 forwards the composite word along bus 335 to delay element 340, which prepares the digital representation of the phase-frequency error signal for digital loop filtering and forwards the delayed representation along conductor 225.

Figure 4:
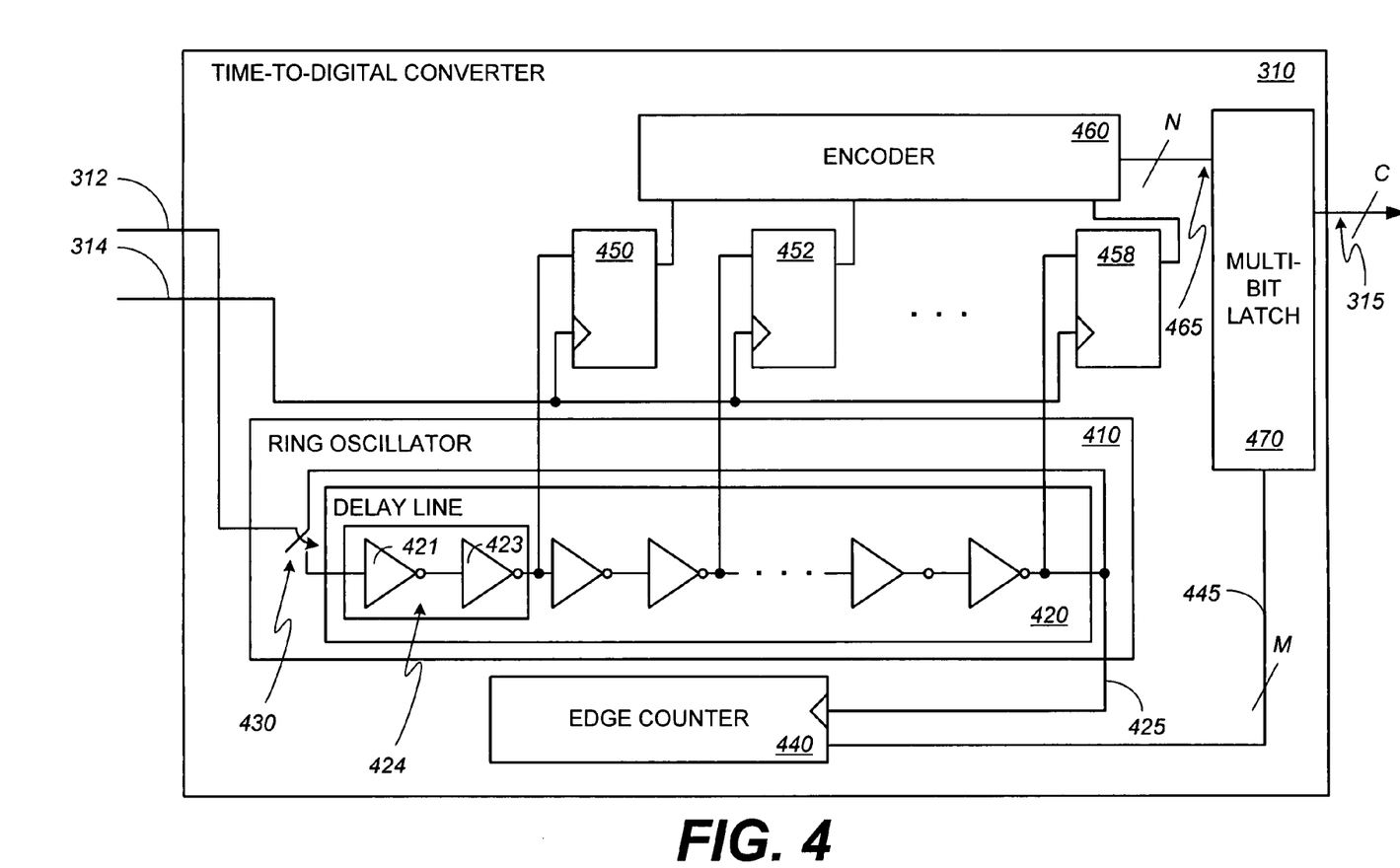
FIG. 4 is a block diagram illustrating an embodiment of one of the time-to-digital converters of FIG. 3.

FIG. 4 is a block diagram illustrating an embodiment of one of the time-to-digital converters of FIG. 3. Time-to-digital converter 310 comprises a ring oscillator 410, edge counter 440, a plurality of latches (latch 450, latch 452, . . . , latch 458), encoder 460, and latch 470. Ring oscillator 410 is configured to receive the UP differential signal via conductor 312 and apply the signal to delay line 420. Delay line 420 comprises a host of inverter pairs coupled in series. For example, inverter 421 and inverter 423 form a delay unit 424 of approximately 30 picoseconds (ps) in duration. When the UP differential signal transitions above a threshold voltage, switch 430 closes coupling the output of delay line 420 to the input of the delay line 420, thus activating ring oscillator 410. The output of ring oscillator 410 is further coupled to an input of edge counter 440, which records each complete cycle of the delay line 420 of the ring oscillator 410. A multiple-bit binary word is forwarded from edge counter 440 to multi-bit latch 470 via bus 445. Multi-bit latch 470 concatenates the N-bit binary word produced by encoder 460 and the M-bit binary word produced by edge counter 440.

When the UP differential signal transitions below a threshold voltage, switch 430 opens and deactivates ring oscillator 410. Substantially, simultaneously therewith differential signal $UP_b$ on conductor 314 transitions above a threshold voltage. As indicated in FIG. 4, conductor 314 applies the $UP_b$ signal to respective enable inputs of latch 450, latch 452, through latch 458. Each of the respective latches are coupled to the output of a delay unit of delay line 420. Accordingly, if the UP differential signal propagated through a particular delay unit before switch 430 opened, a logic "1" is present at a respective latch input when the signal on conductor 314 transitions to a logic "1." Otherwise, if the UP differential signal had not yet propagated through a subsequent delay unit of delay line 420 before switch 430 opened, a logic "0" is present at a respective latch input when the signal on conductor 314 transitions to a logic "1." As illustrated in FIG. 4, each of the latches provides a respective input bit to encoder 460. Encoder 460 converts the received bits into a multiple-bit binary word and forwards the binary word to latch 470 along bus 465. As indicated in FIG. 4, the multiple-bit binary word forwarded from encoder 460 contains N bits. Multi-bit latch 470 arranges the N-bit binary word from encoder 460 in the least significant bit positions and the M-bit binary word from edge counter 440 in the most significant bit positions of a composite word having a length of C bits, where C=M+N. Multi-bit latch 470 provides the composite word, which is a digital representation of the phase frequency error signal, on bus 315.

Figure 5:
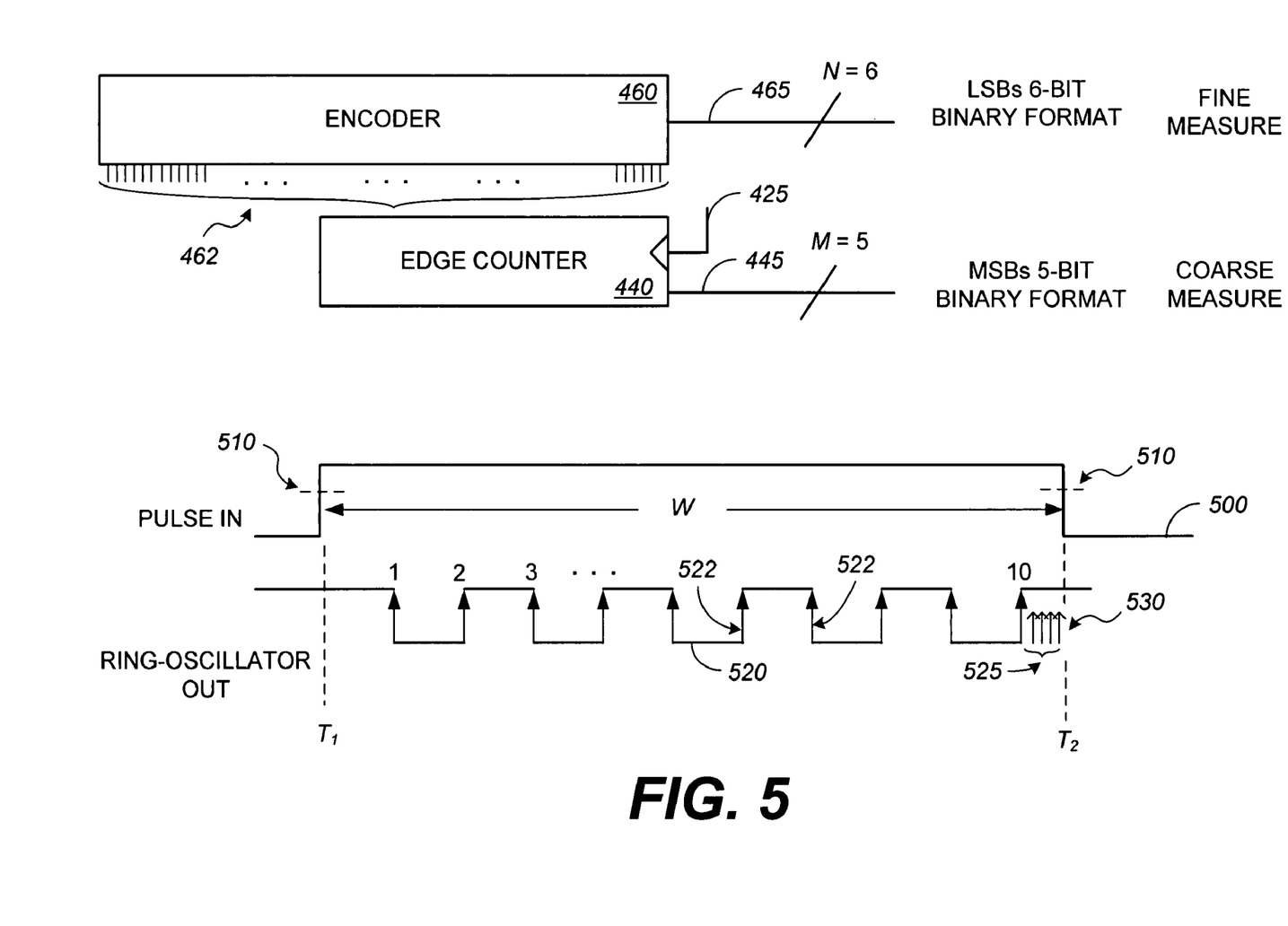
FIG. 5 is a schematic diagram illustrating operation of coarse and fine measurements generated by the edge counter and encoder of FIG. 4.

FIG. 5 is a schematic diagram illustrating operation of coarse and fine phase error measurements generated by the edge counter 440 and the encoder 460 of FIG. 4, respectively. The pulse-in signal trace 500 represents a typical phase error pulse that is applied to input 312 of the time-to-digital converter 310 of FIG. 4. When the pulse-in signal trace 500 transitions above threshold voltage 510 (at time $T_1$) switch 430 is closed and ring oscillator 410 is activated. Input 314 receives a differential version of the phase error pulse as generated by tri-state phase frequency detector 210 (FIG. 3). While ring oscillator 410 is active, edge counter 440 receives an indication of each complete cycle through delay line 420 along conductor 425. Edge counter 440 records each complete cycle that occurs while the pulse-in signal trace 500 remains above threshold voltage 510. Edge counter 440 generates a 5-bit binary word representing a coarse measure of a significant portion of the width of the input pulse. In an embodiment, edge counter 440 provides the 5-bit binary word on bus 445. When the pulse-in signal trace 500 transitions below threshold voltage 510 (at time $T_2$) switch 430 is opened and ring-oscillator 410 is no longer active. Input 314, the differential version of the pulse-in signal trace 500, transitions from a low-voltage level to a high-voltage level at time $T_2$. Input 314 is coupled to a plurality of latches coupled to the output of each of the series coupled delay units 424 within delay line 420. Each respective latch 450, 452, ..., 458 registers a digital 1 or a digital 0 when input 314 transitions. The plurality of digital signals comprise a 64-bit thermometer coded word representing the number of delay units 424 that the pulse-in signal trace 500 propagated through before switch 430 opened. Encoder 460 converts the thermometer coded word into a 6-bit binary word and provides the binary word on bus 465.

Signal trace 520 reveals that ring oscillator 410 completed 10 transitions while pulse-in signal trace 500 is above threshold voltage 510. The 10 completed transitions of the ring oscillator are represented by each of the tall arrows 522. As is further illustrated in FIG. 5, signal trace 520 terminates its oscillation before the transition of pulse-in signal trace 500. When pulse-in signal trace 500 terminates at 510, the oscillation stops but the remaining residue signal continues to propagate. Remainder 525 or the difference in time between the last transition (either positive or negative) of signal trace 520 and the negative transition of pulse-in signal trace 500, is approximated by 4 delay units 424 represented by small arrows 530. The resolution of each delay unit 424 is the time it takes a clock signal to propagate through the respective series coupled inverter pair. In the illustrated embodiment, the time resolution of each delay unit is 30 ps.

As is further shown in FIG. 5, pulse width W can be determined from the following equation.

$$W \cong X \times (2 \times F \text{MHz})^{-1} + (Y \times 30 \text{ ps}),\quad \text{Eq. 1}$$

where X is the number of transitions of the ring oscillator as received from edge counter 440, Y is the number of delay units that reported a logic "1" as received from encoder 460, and F is the oscillation frequency in megahertz (MHz). Solving the equation for the illustrated example, i.e., when X is 10, Y is 4, and F is 258.4 MHz reveals a pulse width of 19.47 nanoseconds (ns).

Figure 6:
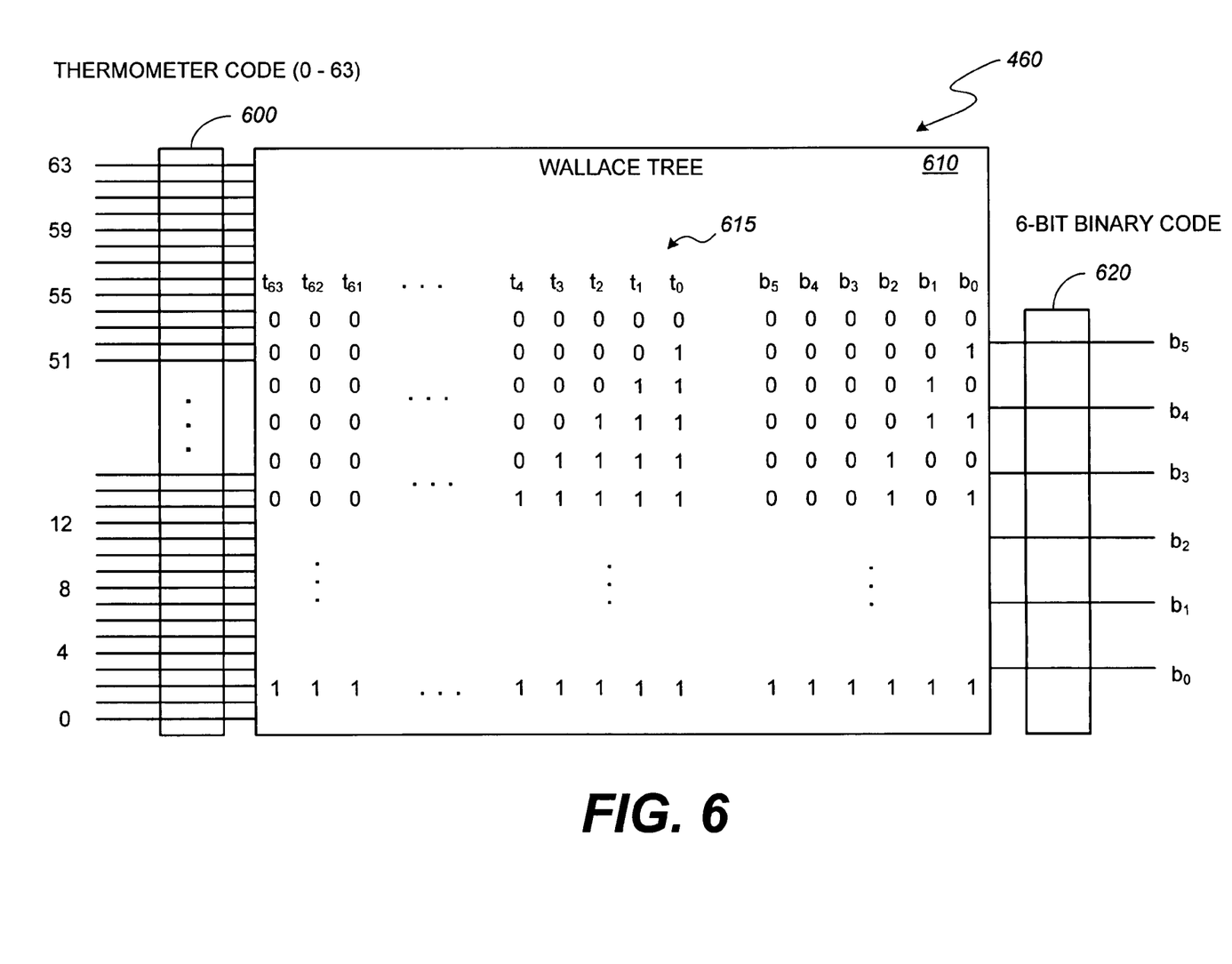
FIG. 6 is a block diagram illustrating an embodiment of the encoder of FIG. 4.

FIG. 6 is a block diagram illustrating an embodiment of the encoder 460 of FIG. 4. Encoder 460 receives a 64-bit thermometer coded unary word at input stage 600. Input stage 600 comprises a plurality of latches or registers that temporarily store a respective digital signal. Encoder 460 comprises Wallace Tree 610 that generates a binary coded word, the magnitude of which is equivalent to the number of logic high bits in the 64-bit thermometer coded word. A Wallace Tree is a combinatorial circuit that uses carry-save adders and a parallel adder. A carry-save adder can add three values simultaneously, instead of just two. However, a carry-save adder does not output a single result. Instead, a carry-save adder outputs both a sum and a set of carry bits. For simplicity of illustration and explanation, FIG. 6 does not include a circuit representation of the array of carry-save adders as a thermometer-to-binary N-bit encoder will include $2^N - N - 1$ full adders. Those skilled in the art of analog-to-digital conversion are familiar with multiple circuits and methods for converting thermometer coded words to binary coded words.

Regardless of the circuits and methods employed, the encoder 460 translates a thermometer coded word at the input 600 and provides a binary coded word at the output 620. As illustrated in table 615, a 64-bit thermometer coded word includes one of 64 variations from no digital high or "1s" to a total of 64 "1s." A thermometer code is a unary code in that each bit from $t_0$ to $t_{63}$ represents the same weight or value in the code. Whereas, a binary coded word is a weighted code as each successive bit represents an increase of $2^N$. Each row in table 615 includes a different thermometer code word and its respective representation as a binary coded word.

Figure 7:
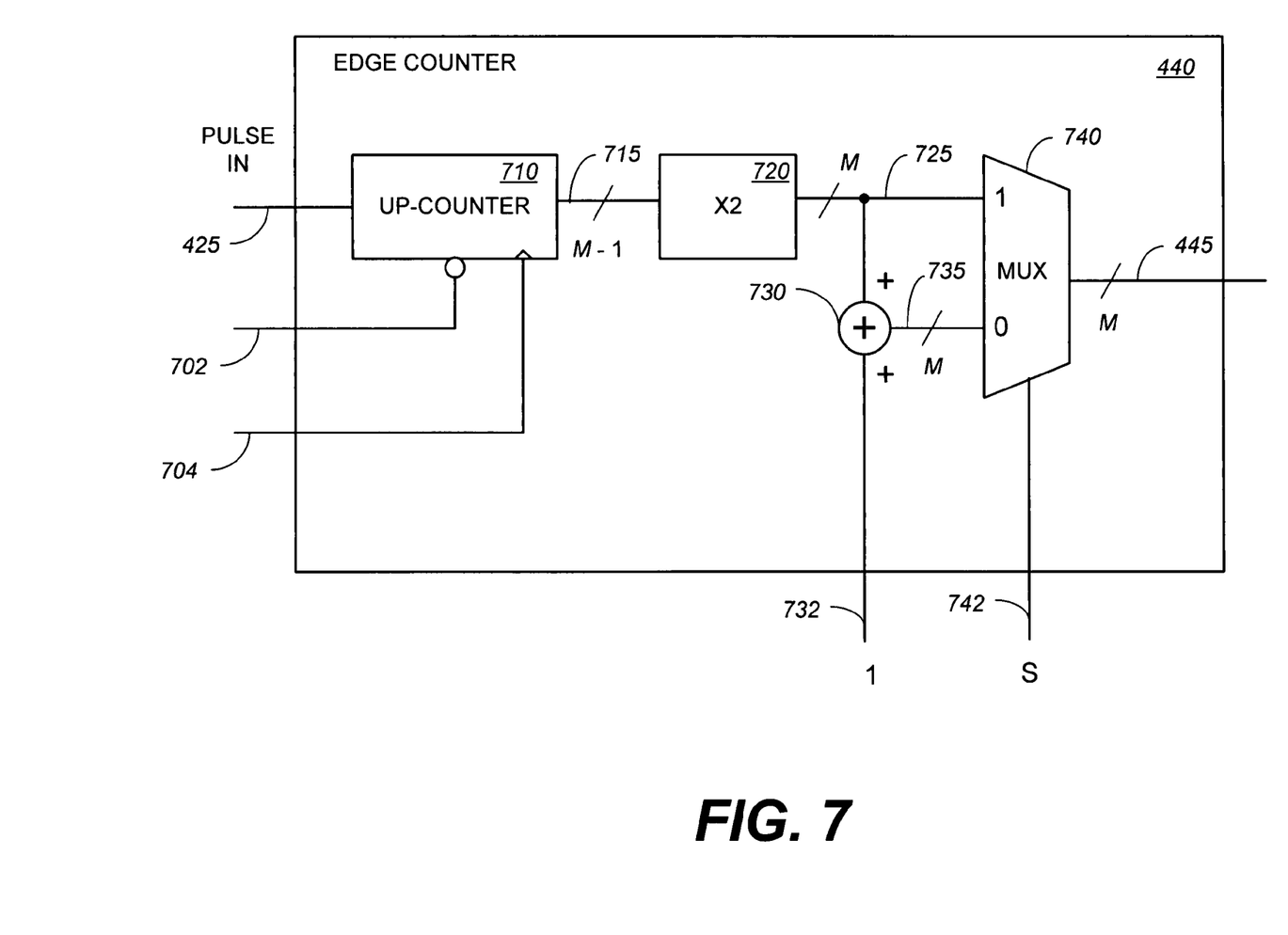
FIG. 7 is a schematic diagram illustrating an embodiment of the edge counter of FIG. 4.

FIG. 7 is a schematic diagram illustrating an embodiment of the edge counter 440 of FIG. 4. Edge counter 440 comprises up-counter 710, multiplier 720, summer 730, and multiplexer 740. In addition to receiving the pulse input on conductor 425, up counter 710 receives a reset signal via conductor 702, a clock input via conductor 704, a plurality of digital "1s" on input bus 732, and a switch input on conductor 742.

Up-counter 710 is coupled to multiplier 720 via bus 715. Up-counter 710 records each digital transition from a logic low-voltage level to a logic high-voltage level of the pulse-in signal on conductor 425 that occurs between reset signal pulses received along conductor 702. Reset signal pulses "reset" the up-counter state upon each occurrence of a pulse in signal transition on conductor 425. Multiplier 720 is directly coupled to the first of two multiplexer inputs and the positive input of summer 730 via bus 725. Multiplier 720, which is a 2× multiplier, doubles the number of transitions recorded by up-counter 710 to accurately reflect the total number of digital transitions (both up and down) in the pulse-in signal. The negative input of summer 730 is directly coupled to input bus 732. The output of summer 730 is provided on bus 735 to the second of the two multiplexer inputs. Multiplexer 740 is a one-way digital switch which selects the digital information on one of bus 725 or bus 735 in response to the switch input on conductor 742 and provides the digital information on bus 445.

Figure 8:
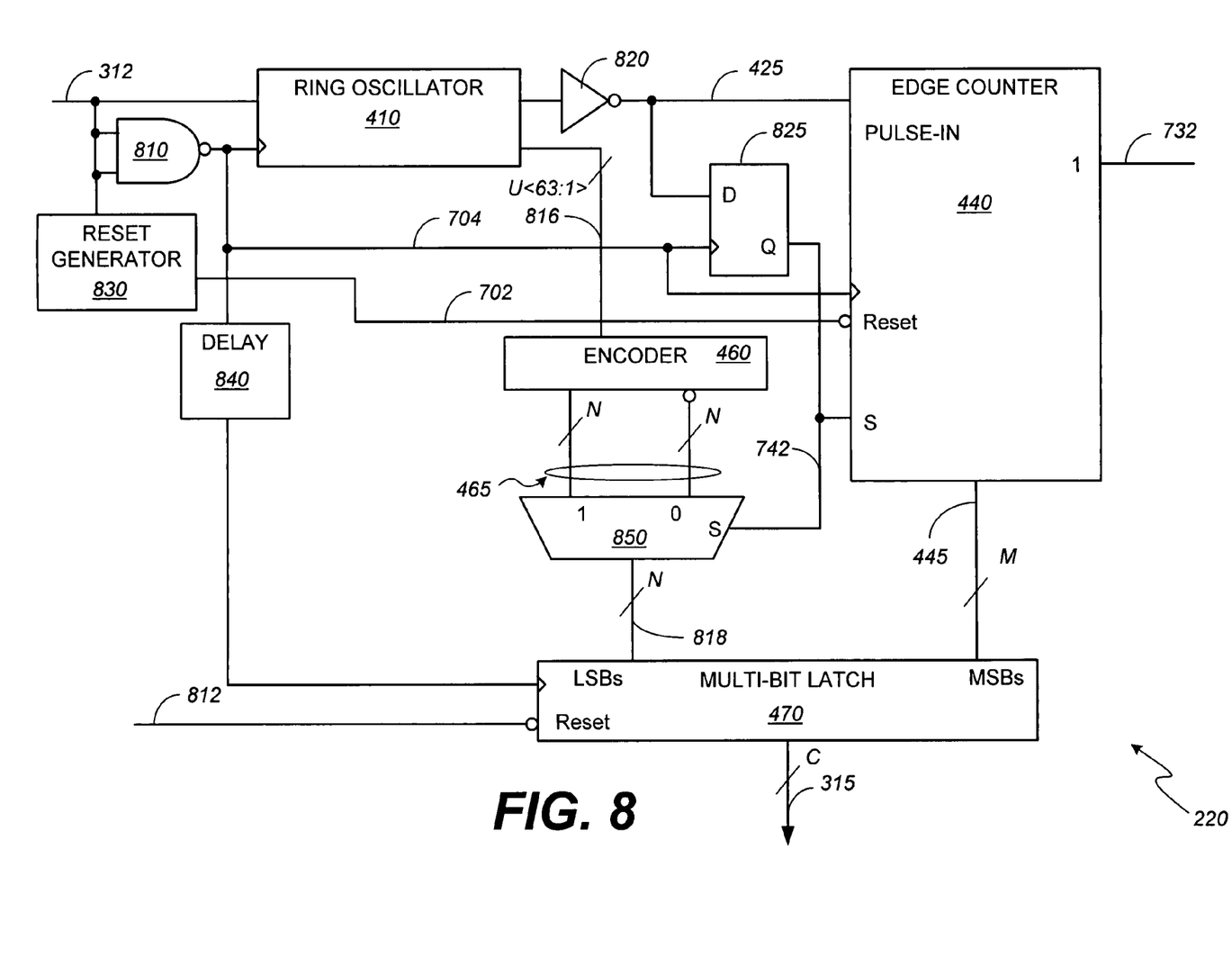
FIG. 8 is a detailed block diagram illustrating an embodiment of the error detector of FIG. 2.

FIG. 8 is a detailed block diagram illustrating an embodiment of the error detector 220 of FIG. 2. Error detector 220 comprises ring oscillator 410, edge counter 440, encoder 460, and multi-bit latch 470. Error detector 220 receives a differential signal via conductor 312 which is applied to a first input of ring oscillator 410 and to the inputs of NAND gate 810 before being forwarded to the clock input of ring oscillator 410. Error detector 220 further receives a power-on reset signal via conductor 812 and a digital "1" via conductor 732. The power-on-reset signal is coupled via conductor 812 to a reset input of multi-bit latch 470. The digital "1" is forwarded to edge counter 440 as described above. Ring oscillator 410 forwards an output signal responsive to the number of completed cycles through the delay line 420 (not shown) via a first output and inverter 820 to a pulse-in input of edge counter 440. Edge counter 440 forwards a first binary word that represents the number of completed cycles along bus 445 to multi-bit latch 470.

In addition, ring oscillator 410 forwards a 64-bit unary word on bus 816 to encoder 460. Flip-flop 825 receives the inverted first output signal via conductor 425 at a data input. Conductor 704 couples the output of NAND gate 810 to delay 840 and clock inputs of flip-flop 825 and edge counter 440. Accordingly, the digital signal voltage present at the data input when the clock input transitions above a threshold voltage is forwarded along conductor 742, which couples the output of flip-flop 825 with switch control inputs of edge counter 440 and multiplexer 850, respectively. Delay 840 is introduced to permit the sampled data to propagate in a coordinated fashion to multi-bit latch 470. Reset generator 830 receives a differential signal via conductor 312 and produces a signal that is applied via conductor 702 to reset edge counter 440 upon each new pulse at the input to ring oscillator 410. Accordingly, conductor 702 couples the reset signal from reset generator 830 to a reset input of edge counter 440. Because conductor 704 couples the output of NAND gate 810 to delay 840 and the clock inputs of flip-flop 825 and edge counter 440, any residue output from ring oscillator 410 is ignored by edge counter 440.

Encoder 460, as described above, converts the 64-bit unary word (thermometer coded) received from ring oscillator 410 along bus 816 into a multiple bit binary coded representation and places the result on bus 465 to both inputs of multiplexer 850. Multiplexer 850 forwards the binary coded representation of the thermometer coded output of ring oscillator 410 via bus 818 to multi-bit latch 470. Multiplexer 850 selects one of the two available multiple bit inputs in accordance with the switch control input signal on conductor 742.

As shown in FIG. 8, multi-bit latch 470 is arranged to concatenate the first and second binary words. The first binary word provided by edge counter 440 is applied to the most significant bits of a composite word produced by multi-bit latch 470. The second binary word provided by the encoder 460 via multiplexer 850 and bus 818 is applied to the least significant bits of the composite word. Multi-bit latch 470 forwards the composite word along output bus 315 in accordance with the delayed clock input signal provided by conductor 702.

Figure 9:
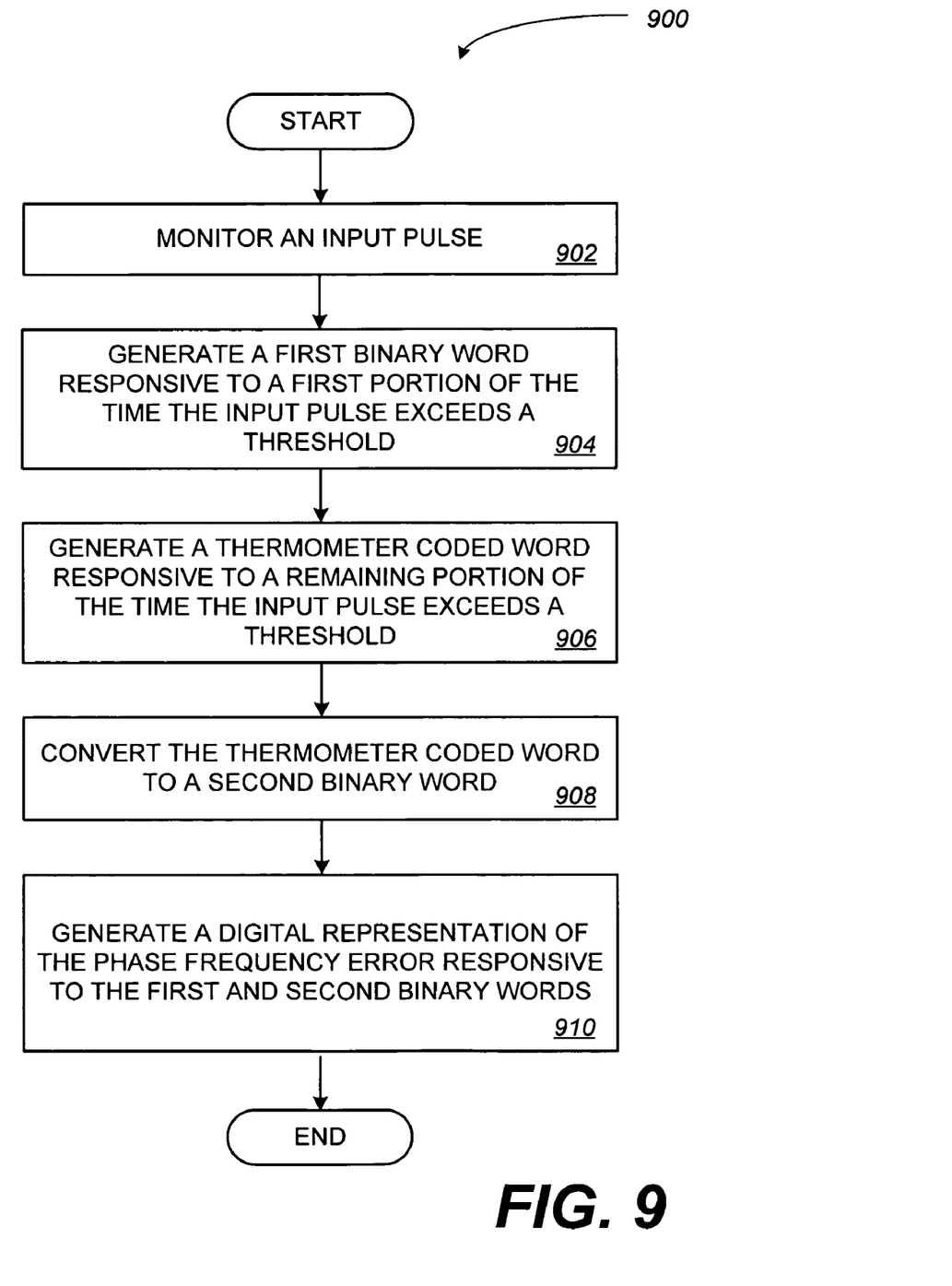
FIG. 9 is a flow diagram illustrating an embodiment of a method for phase frequency error detection.

FIG. 9 is a flow chart illustrating an embodiment of a method for digital phase frequency error detection. Method 900 begins with block 902 where an input pulse is monitored. The input pulse is responsive to the relative position in time of a first signal to a reference signal. When the first signal leads the reference signal an error signal or input pulse is generated. When the first signal lags the reference signal an input pulse of opposite polarity is generated. Regardless of whether the first signal leads or lags the reference signal, the width of the input pulse approximates the duration of the difference between the two signals.

As indicated in block 904, a first binary word responsive to the time the input pulse exceeds a threshold is generated. As described above, the first binary word can be generated by counting the number of complete cycles of a ring oscillator having a known delay. The first binary word provides a coarse measure of a portion of the width of the input pulse. Next, in block 906, a thermometer coded word responsive to the remainder of the width of the input pulse as determined by the length of a partial cycle of the ring oscillator is generated. The thermometer coded word provides a fine measurement of a remaining portion of the input pulse width. After the thermometer coded word is generated, the thermometer coded word is converted to a binary coded word, thus generating a second binary word, as shown in block 908. Finally, the first and second binary words are used to generate a digital representation of the phase frequency error, as indicated in block 910. As described above, the phase frequency error can be used to control an oscillator in a phase-locked loop control system.

While various embodiments of the circuits and methods for phase frequency error detection have been described, it will be apparent to those of ordinary skill in the art that many more embodiments and implementations are possible that are within the scope of this disclosure. Accordingly, the circuits and methods for phase frequency error detection are not to be restricted except in light of the attached claims and their equivalents.

What is claimed is:

1. A digital phase-frequency error detector, comprising:
a phase-frequency detector configured to receive an input signal and a sampled reference signal responsive to a loop filter, a voltage controlled oscillator and a divide by N counter, the phase-frequency detector configured to generate first and second differential signals; and
an error detector coupled to the first and second differential signals and configured to generate a phase-frequency error signal responsive to the first and second differential signals, the error detector having respective time-to-digital converters, a summer and a delay element, the respective time-to-digital converters, comprising:
a ring oscillator configured to receive the differential signal and having a clock input, a first output responsive to a single cycle of the ring oscillator and a multiple-bit second output responsive to the differential signal, wherein the multiple-bit second output represents time from an edge transition of the clock to an edge transition of the differential signal;
a counter coupled to the first output and configured to generate a first binary word;
an encoder coupled to the multiple-bit second output and configured to generate a second binary word; and
a latch coupled to the counter and the encoder, the latch configured to generate a composite word comprising the first and second binary words, wherein the composite word generated by the respective time-to-digital converters is processed by the summer and the delay element to generate a digital representation of the phase-frequency error.

2. The detector of claim 1, wherein the ring oscillator comprises a plurality of pairs of series coupled inverters.

3. The detector of claim 1, wherein the second output comprises a multiple-bit unary format word.

4. The detector of claim 1, wherein the second output comprises a thermometer coded word.

5. The detector of claim 1, wherein the encoder converts a thermometer coded word to a binary word.

6. The detector of claim 5, wherein the encoder comprises a Wallace tree encoder.

7. The detector of claim 1, wherein the latch applies the first binary word to the most significant bits and the second binary word to the least significant bits of the composite word.

8. The detector of claim 1, wherein the counter is responsive to digital signal transitions.

9. A method for phase frequency error detection, comprising:
monitoring an input pulse responsive to the relative phase frequency difference between a first signal and a reference signal responsive to at least one of a loop filter, a voltage controlled oscillator and a divide by N counter;

generating a first error signal having a pulse width that approximates the difference in phase/frequency between the first signal and the reference signal when the first signal leads the reference signal;

generating a second error signal having a pulse width that approximates the difference in phase/frequency between the first signal and the reference signal when the first signal lags the reference signal;

applying the first error signal to a first time-to-digital converter;

applying the second error signal to a second time-to-digital converter;

each of the first and second time-to-digital converters, generating a first binary word responsive to the time the respective error signal exceeds a threshold, the first binary word comprising an integer multiple of a delay unit;

generating a thermometer coded word responsive to the time the respective error signal exceeds a threshold in addition to the time represented by the first binary word;

converting the thermometer coded word to a second binary word; and generating a respective digital representation of the phase frequency error responsive to the first and second binary words;

summing the respective digital representations to generate a summed error signal; and applying the summed error signal to a delay line to generate an error detector output before forwarding the error detector output to a loop filter.

10. The method of claim 9, wherein monitoring comprises using a ring oscillator.

11. The method of claim 10, wherein the ring oscillator comprises a delay line.

12. The method of claim 10, wherein generating a first binary word comprises counting completed oscillations of the ring oscillator.

13. The method of claim 12, wherein counting is responsive to digital transitions.

14. The method of claim 9, wherein generating a thermometer coded word comprises latching respective outputs of inverter pairs along a delay line.

15. The method of claim 9, wherein generating a respective digital representation of the phase-frequency error comprises applying the first binary word to the most significant bits of phase-frequency error signal.

16. A portable transceiver having a digital phase-frequency error detector, the portable transceiver comprising:

an antenna;

a radio-frequency subsystem coupled to the antenna, the radio-frequency subsystem comprising a frequency synthesizer having a phase-locked loop that uses a tri-state phase-frequency detector configured to receive an input signal and a sampled reference signal responsive to at least one of a loop filter, a voltage controlled oscillator and a divide by N counter, the tri-state phase frequency detector configured to generate first and second differential signals and an error detector coupled to the first and second differential signals, the error detector configured to generate a phase-frequency error signal responsive to the first and second differential signals, the error detector having respective time-to-digital converters, a summer and a delay element, the respective time-to-digital converters, comprising:

a ring oscillator having a first input, a clock input, a first output responsive to a single cycle of the ring oscillator and a second output responsive to a signal applied at the first input;

a counter coupled to the first output and configured to generate a first binary word;

an encoder coupled to the second output and configured to generate a second binary word; and a latch coupled to the counter and the encoder, the latch configured to generate a composite word comprising the first and second binary words.

17. The transceiver of claim 16, wherein the ring oscillator comprises a delay line that is shorter in time than a target reference cycle.

18. The transceiver of claim 17, wherein the counter has a resolution that is finer than the length of the target reference cycle.

19. The transceiver of claim 16, wherein the counter counts the rising and falling edges of the first ring oscillator output.

20. The transceiver of claim 16, wherein the composite word comprises a set of most significant bits the maximum resolution of which represent a time that is longer in duration than a target phase error pulse width and a set of least significant bits that represent a time that approximates the delay of a signal propagated through a series-coupled inverter pair.

* * * * *